US012713892B2

(12) United States Patent
Choi et al.

(10) Patent No.: US 12,713,892 B2
(45) Date of Patent: Aug. 18, 2026

(54) SEMICONDUCTOR DEVICE INCLUDING INTERCONNECT STRUCTURE WITH METAL JUMP STRUCTURE CONNECTING ADJACENT METAL LINES

(71) Applicant: SAMSUNG ELECTRONICS CO., LTD., Suwon-si (KR)

(72) Inventors: Jaemyung Choi, Niskayuna, NY (US); Johnsoo Kim, Clifton Park, NY (US); Joongsuk Oh, Watervliet, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/931,666

(22) Filed: Oct. 30, 2024

(65) Prior Publication Data

US 2025/0349721 A1 Nov. 13, 2025

Related U.S. Application Data

(60) Provisional application No. 63/645,367, filed on May 10, 2024.

(51) Int. Cl.
*H01L 23/535* (2006.01)
*H10W 20/00* (2026.01)
(Continued)

(52) U.S. Cl.
CPC ......... *H10W 20/20* (2026.01); *H10W 20/033* (2026.01); *H10W 20/0698* (2026.01); *H10W 20/083* (2026.01); *H10W 20/425* (2026.01)

(58) Field of Classification Search
CPC ............. H01L 23/535; H01L 21/76805; H01L 21/76843; H01L 21/76895;
(Continued)

(56) References Cited

U.S. PATENT DOCUMENTS 9,859,210 B2 1/2018 Song et al.
11,031,337 B2 6/2021 Amanapu et al.
(Continued)

FOREIGN PATENT DOCUMENTS

WO 2025120406 A1 6/2025

OTHER PUBLICATIONS

Extended European Search Report corresponding to EP 25164038.9; Dated: Sep. 18, 2025, (12 pp).
(Continued)

*Primary Examiner* — Dzung Tran
(74) *Attorney, Agent, or Firm* — Myers Bigel, P.A.

(57) ABSTRACT

Provided is a semiconductor device which includes: a base layer; a $1^{st}$ metal line extended in a $1^{st}$ direction on the base layer; a $2^{nd}$ metal line extended in the $1^{st}$ direction, and adjacent to the $1^{st}$ metal line at a same level, on the base layer; and a metal jumper, between the $1^{st}$ metal line and the $2^{nd}$ metal line, at the same level, wherein the metal jumper connects the $1^{st}$ metal line and the $2^{nd}$ metal line.

14 Claims, 14 Drawing Sheets

(51) Int. Cl.
*H10W 20/20* (2026.01)
*H10W 20/41* (2026.01)

(58) Field of Classification Search
CPC ............ H01L 23/53252; H10W 20/20; H10W 20/425; H10W 20/033; H10W 20/0698; H10W 20/083
See application file for complete search history.

(56) References Cited

U.S. PATENT DOCUMENTS 11,424,188 B2 8/2022 Tsai et al.
2003/0075807 A1 4/2003 Hsue et al.
2006/0019490 A1* 1/2006 Chou .................... H01L 24/13 257/E23.021
2013/0277860 A1* 10/2013 Weng .................... H01L 23/481 257/773
2015/0136008 A1* 5/2015 Nielsen ................ E21B 17/015 114/264
2015/0194427 A1* 7/2015 Sengupta ........... H10D 84/0158 438/283
2016/0027797 A1* 1/2016 Li ........................ H01L 21/308 257/773
2016/0111328 A1 4/2016 Mei et al.
2016/0300839 A1* 10/2016 Kim ...................... H10D 84/85
2016/0372414 A1* 12/2016 Song ..................... H10D 89/10
2018/0261536 A1 9/2018 Zhang et al.
2019/0148245 A1* 5/2019 Baars .................. H10D 64/691 257/351
2019/0206725 A1* 7/2019 Chu .................. H01L 21/76897
2020/0083094 A1 3/2020 Ding et al.
2023/0066614 A1 3/2023 Clevenger et al.
2023/0197802 A1 6/2023 Chen et al.
2023/0411473 A1 12/2023 Frougier et al.

OTHER PUBLICATIONS

"Office Action for European Patent Application No. 25164038.9, dated Jun. 19, 2026, 9 pages".

* cited by examiner

SEMICONDUCTOR DEVICE INCLUDING INTERCONNECT STRUCTURE WITH METAL JUMP STRUCTURE CONNECTING ADJACENT METAL LINES

CROSS-REFERENCE TO RELATED APPLICATIONS

This application is based on and claims priority from U.S. Provisional Application No. 63/645,367 filed on May 10, 2024 in the U.S. Patent and Trademark Office, the disclosure of which is incorporated herein in its entirety by reference.

BACKGROUND

1. Field

Apparatuses and methods consistent with embodiments of the disclosure relate to a semiconductor device including an interconnect structure in which a metal jump structure is formed between adjacent two metal lines.

2. Description of the Related Art

Performance of a semiconductor device is affected by how an interconnect structure is formed in the semiconductor device. The interconnect structure includes back-end-of-line (BEOL) structures such as metal lines and vias which connect front-end-of-line (FEOL) structures to a voltage source or other circuit elements through middle-of-line (MOL) structures. The FEOL structures include transistor structures such as a channel structure, source/drain regions, and a gate structure, and the MOL structures include contact plugs formed on the source/drain regions and the gate structures.

As semiconductor devices are developed to have a high device density and performance, design and formation of an interconnect structure including metal lines and vias in a critical pitch area become more difficult and complicated while improved resistance and capacitance (RC) characteristics are required for the semiconductor device.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides example embodiments of an interconnect structure of a semiconductor device in which adjacent metal lines at a same metal layer or level are connected through a metal jumper without using overlying or underlying metal lines or vias.

According to one or more embodiments, there is provided a semiconductor device which may include: a base layer; a $1^{st}$ metal line extended in a $1^{st}$ direction on the base layer; a $2^{nd}$ metal line extended in the $1^{st}$ direction, and adjacent to the $1^{st}$ metal line at a same level, on the base layer; and a metal jumper, between the $1^{st}$ metal line and the $2^{nd}$ metal line, at the same level, wherein the metal jumper connects the $1^{st}$ metal line and the $2^{nd}$ metal line.

According to one or more embodiments, there is provided a semiconductor device which may include: a base layer; and a plurality of metal lines extended in a $1^{st}$ direction at a same level on the base layer, wherein a $1^{st}$ metal line among the plurality of metal lines has a protrusion protruded toward a $2^{nd}$ metal line adjacent to the $1^{st}$ metal line in a $2^{nd}$ direction intersecting the $1^{st}$ direction, the protrusion connecting the $1^{st}$ metal line and the $2^{nd}$ metal line.

According to one or more embodiments, there is provided a method of manufacturing a semiconductor device. The method may include: providing a base layer; forming a $1^{st}$ metal line and a $2^{nd}$ metal line to be adjacent and extended in a $1^{st}$ direction at a same level on the base layer; and forming a metal jumper, between the $1^{st}$ metal line and the $2^{nd}$ metal line, at the same level such that the metal jumper connects the $1^{st}$ metal line and the $2^{nd}$ metal line.

BRIEF DESCRIPTION OF DRAWINGS

Example embodiments of the disclosure will be more clearly understood from the following detailed description taken in conjunction with the accompanying drawings as follows.

FIG. 1 illustrates a plan view of semiconductor device including an interconnect structure.

DETAILED DESCRIPTION

Figure 3:
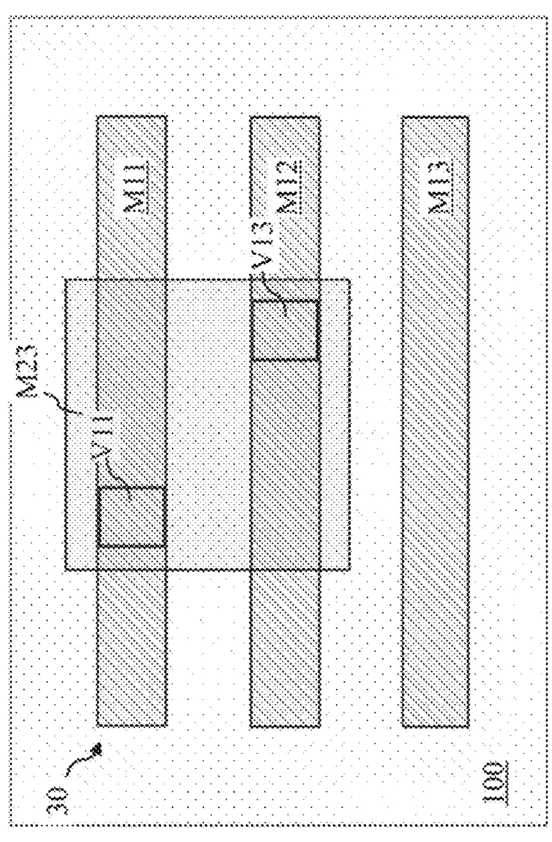
FIGS. 2 and 3 illustrate plan views of semiconductor devices each including an interconnect structure, according some embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "1st" element or a "2nd" element, respectively, as long as their structural relationship is clearly understood in the context of the descriptions. Similarly, the terms a "lower" element and an "upper" element may be respectively referred to as a "1st" element and a "2nd" element with necessary descriptions to distinguish the two elements.

It will be understood that, although the terms "$1^{st}$," "$2^{nd}$," "$3^{rd}$," "$4^{th}$," "$5^{th}$" "$6^{th}$" etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Herein, a term "isolation" may refer to electrical isolation or insulation.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements of a semiconductor device may or may not be described in detail herein or shown in the drawings. For example, MOL or FEOL structures may not be shown or described in detail when these structures are not relevant to the concept of the disclosure.

Herebelow, various embodiments of the disclosure are described in reference to the accompanying drawings.

Figure 1:
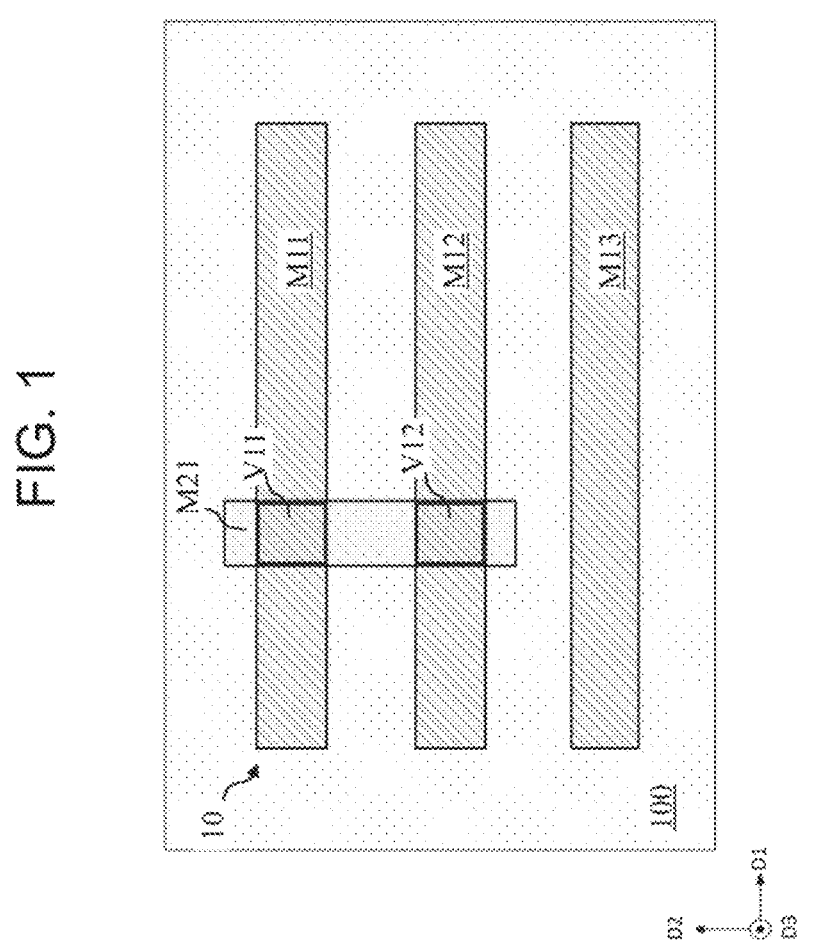

FIG. 1 illustrates a plan view of semiconductor device including an interconnect structure.

Referring to FIG. 1, an interconnect structure 10 formed in a BEOL process may be disposed on a base layer 100. Here, the base layer 100 may be a BEOL layer including another interconnect structure, a middle-of-line (MOL) layer including one or more contact structures, or a front-end-of-line (FEOL) layer including one or more active devices (e.g., transistor structure) or passive devices (e.g., capacitor) of a semiconductor device.

The interconnect structure 10 may include a plurality of M1 metal lines M11-M13, a plurality of vias V11 and V12 formed on the M1 metal lines M11 and M12, and an M2 metal line M21 connecting the M1 metal lines M11 and M12 through the vias V11 and V12. The M1 metal lines may be formed to be extended in a $1^{st}$ direction D1 and arranged at a predetermined pitch in a $2^{nd}$ direction D2 perpendicular to the $1^{st}$ direction D1. The M1 metal lines may be formed at a same level, for example, at an M1 level (or M1 metal layer). Thus, bottom surfaces of the M1 metal lines may be horizontally coplanar or aligned, and top surfaces thereof may also be horizontally coplanar or aligned, in the $1^{st}$ direction D1 and the $2^{nd}$ direction. The M1 and M2 metal lines and the vias V11 and V12 may be formed of a metal or metal compound including ruthenium (Ru), molybdenum (Mo), etc., not being limited to, which can be formed through not a damascene process but direct etching on an initial metal structure formed of the same metal or metal compound.

When there is a design requirement for connecting the M1 metal lines M11 and M12 adjacent to each other in the 2$^{nd}$ direction D2, the current design/manufacturing scheme for metal lines does not allow a direct connection of the two M1 metal lines in the 2$^{nd}$ direction D2 if the M1 metal lines are formed in a very high-density area or a critical minimum metal-pitch area through a self-aligned method using spacers defining a metal-to-metal distance. Thus, the two M1 metal lines may be connected at an upper level, for example, an M2 or M3 level (or M2 or M3 metal layer), through two or more vias at one or more via layers. However, a minimum via-to-via distance limitation in the critical minimum metal-pitch area also does not allow the two vias V11 and V12 formed at a same level (or via layer) to be arranged in the 2$^{nd}$ direction D2 and connected to each other through an overlying M2 metal line as shown in FIG. 1.

Figure 2:
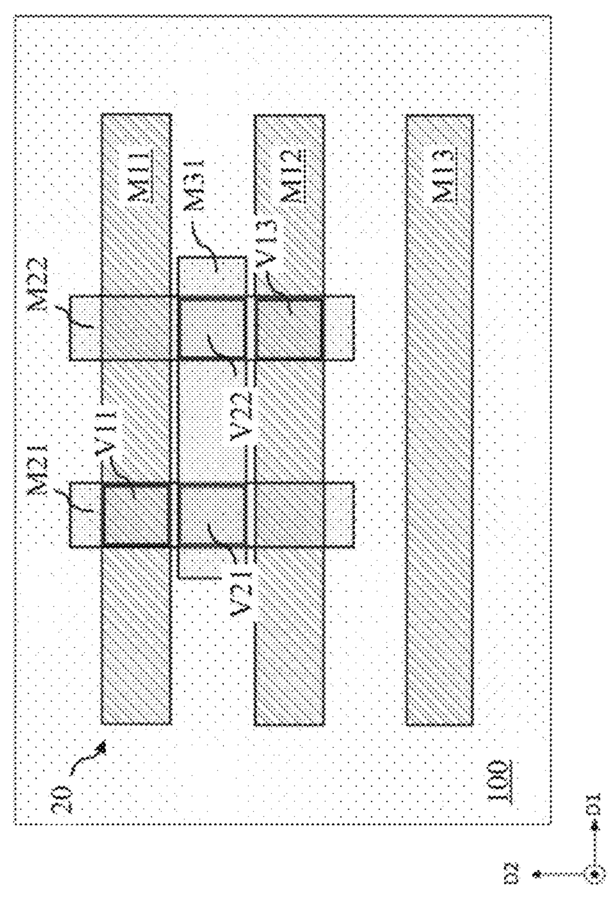

Thus, the M1 metal lines M11 and M12 may be connected using two vias which are not arranged in the 2$^{nd}$ direction D2, and instead, horizontally offset from each other on the two M1 metal lines M11 and M12, respectively, as shown in FIGS. 2 and 3.

FIGS. 2 and 3 illustrate plan views of semiconductor devices each including an interconnect structure, according some embodiments.

Referring to FIG. 2, an interconnect structure 20 may include the base layer 10, the M1 metal lines M11-M13, the via V11, and the M2 metal line M21 which may be the same as those of the interconnect structure 10 shown in FIG. 1, and thus, duplicate descriptions thereof may be omitted herein.

In the interconnect structure 20, the M1 metal lines M11 and M12 may be connected through two horizontally-offset vias V11 and V13, two adjacent M2 metal lines M21 and M22, two vias V21 and V22, and an M3 metal line M31. These metal lines and vias may have the same material composition as those of the interconnect structure 10.

The vias V11 and V13 are formed in a 1$^{st}$ via layer on the M1 metal lines M11 and M12, respectively. The M2 metal lines M21 and M22 respectively formed at the same M2 level (or M2 metal layer) on the vias V11 and V13 may be extended in the 2$^{nd}$ direction D2 and arranged in the 1$^{st}$ direction D1. The two vias V21 and V22 may be formed in a 2$^{nd}$ via layer on the two M2 metal lines M21 and M22, respectively. The M3 metal line M31 may be formed at an M3 level (or M3 metal layer) on the 2$^{nd}$ via layer to connect these two vias V21 and V22 by being extended in the 1$^{st}$ direction D1.

Here, the connection of the two metal lines M11 and M12 in the critical minimum metal-pitch area requires a number of additional interconnects including the vias V11, V13, V21 and V22, the M2 metal lines M21 and M22, and the M3 metal line M31 at for upper levels (two metal layers and two via layers). Thus, formation of the interconnect structure 20 for a semiconductor device may become complicated and cause area penalties for a semiconductor device including the interconnect structure 20. Accordingly, another interconnect structure scheme may be considered as below.

Referring to FIG. 3, an interconnect structure 30 may include the base layer 10, the M1 metal lines M11-M13, and the vias V11 and V13, which may be the same as those of the interconnect structure 20 shown in FIG. 2, and thus, duplicate descriptions thereof may be omitted herein.

In the interconnect structure 30, the M1 metal lines M11 and M12 may be connected through two horizontally-offset vias V11 and V13 in the 1$^{st}$ via layer and a single wide M2 metal line M23 at the M2 level (M2 metal layer) extended both in the 1$^{st}$ direction D1 and the 2$^{nd}$ direction D2 to cover both vias V11 and V13. However, in addition to using two more layers (one metal layer and one via layer), the wide area of the M2 metal line M23 prevents formation of other circuit elements or other metal lines or vias in that space occupied by the M2 metal line M23, which also causes an unnecessary area penalty in the critical minimum metal-pitch area.

The following embodiments may address the foregoing problems of the interconnect structures 20 and 30 shown in FIGS. 2 and 3, respectively.

Figure 4B:
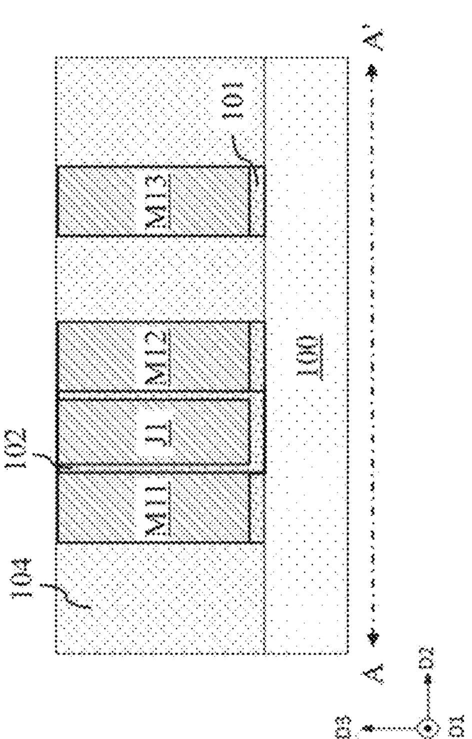
FIG. 4B illustrates a cross-section view of the semiconductor device of FIG. 4A taken along a line A-A' shown in FIG. 4A, according to one or more embodiments.
Figure 4A:
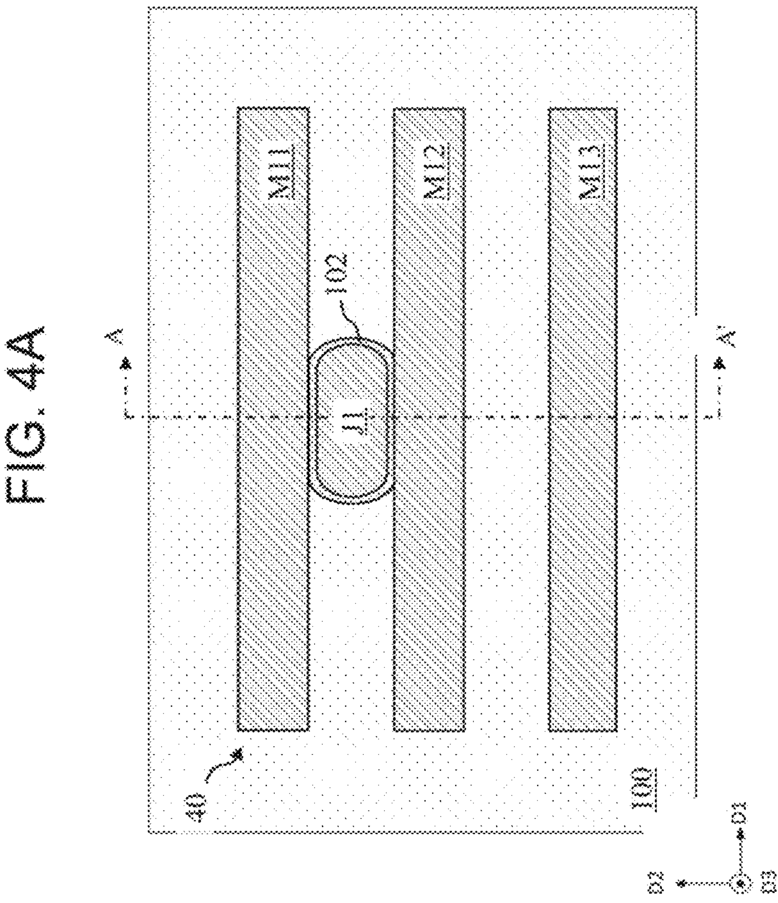
FIG. 4A illustrates a plan view of a semiconductor device including an interconnect structure with a metal jumper connecting metal lines at a same level, according one or more embodiments.

FIG. 4A illustrates a plan view of a semiconductor device including an interconnect structure with a metal jumper connecting metal lines at a same level, according one or more embodiments, and FIG. 4B illustrates a cross-section view of the semiconductor device of FIG. 4A taken along a line A-A' shown in FIG. 4A, according to one or more embodiments.

Referring to FIGS. 4A and 4B, an interconnect structure 40 may include the base layer 10 and the M1 metal lines M11-M13 which may be the same as those of the interconnect structures 20 and 30 shown in FIGS. 2 and 3, and thus, duplicate descriptions thereof may be omitted herein.

However, unlike the interconnect structures 20 and 30, the interconnect structure 40 may include a metal jumper J1 to connect the two M1 metal lines M11 and M12 at the same level as these two M1 metal lines, as shown in FIG. 4B. Further, the metal jumper J1 may connect only a portion of the M1 metal line M11 to a portion of the M1 metal line M12 facing in the 2$^{nd}$ direction D2 as shown in FIG. 4A. Thus, a length of the metal jumper J1 in the 1$^{st}$ direction D1 may be smaller than a length of at least one or each of the two metal lines M11 and M12. Thus, the interconnect structure 40 may dispense without the upper-level vias or metal lines formed in the interconnect structures 20 and 30 or without lower-level vias or metal lines. Thus, a connection length is shortened, thereby reducing a contact resistance, and further, an area gain may be achieved. In addition, a manufacturing process of the interconnect structure 40 may be simplified compared to those of the interconnect structures 20 and 30.

The metal jumper J1 may have the same metal or metal compound as the M1 metal lines M11-M13, for example, ruthenium (Ru). However, according to one or more other embodiments, the metal jumper may include a different metal or metal compound including copper (Cu), tungsten (W), cobalt (Co), aluminum (Al), etc., not being limited thereto. A top surface of the metal jumper J1 may be horizontally coplanar or aligned with top surfaces of the M1 metal lines M11-M13. Alternatively, the top surface of the metal jumper J1 may be at a higher or lower level than the top surfaces of the M1 metal lines M11-M13, according to one or more other embodiments.

In the interconnect structure 40, 1$^{st}$ contact liners 101 may be formed between the base layer 100 and the overlying M1 metal lines M11-M13, respectively. For example, the 1$^{st}$ contact liners 101 may be formed on bottom surfaces of the M1 metal lines M11-M13 or a top surface of the base layer 100 where the metal lines M11-M13 are connected to the base layer. Further, a 2$^{nd}$ contact liner may be formed between the base layer 100 and the metal jumper J1, between the metal jumper J1 and the M1 metal line M11, and between the metal jumper J1 and the M1 metal line M13. For example, the $2^{nd}$ contact liner 102 may be formed on a bottom surface of the metal jumper J1 or the top surface of the base layer 100 where the metal jumper J1 is connected to the base layer 100. The $2^{nd}$ contact liner 102 may be extended in a $3^{rd}$ direction D3 on a right side surface of the M1 metal line M11 and a left side surface of the M1 metal line M12.

The contact liners 101 and 102 may be provided to reduce a contact resistance and enhance adhesion properties between each of the M1 metal lines M11-M13 and an underlying structure in the base layer 100 and between the metal jumper J1 and each of the M1 metal lines M11 and M12. The contact liners 101 and 102 may each be formed of a material such as titanium nitride (TiN), tantalum nitride (TaN), etc., not being limited thereto.

Alternatively, when the metal jumper J1 is to be isolated from the underlying structure on the base layer 100 while connecting the two M1 metal lines M11 and M12, a dielectric layer or an air gap may be formed between the metal jumper J1 and the base layer 100, according to one or more other embodiments. Thus, in this case, the bottom surface of the metal jumper J1 may be at a level higher than the bottom surface of at least one of the two metal lines M11 and M12. At this time, the $2^{nd}$ contact liner 102 may be or may not be formed on the side surfaces of the M1 metal lines M11 and M12 connected to the metal jumper J1, according to one or more other embodiments.

An inter-metal dielectric (IMD) material such as silicon oxide ($SiO_2$) may be formed as an IMD layer 104 to surround the M1 metal lines M11-M13 and the metal jumper J1 for isolation purposes.

Herebelow, a method of manufacturing a semiconductor device including an interconnect structure with metal jumpers is provided.

FIGS. 5A-5F illustrate cross-section views of intermediate semiconductor devices after respective steps of manufacturing a semiconductor device including an interconnect structure in which a metal jumper is formed to connect two adjacent metal lines at a same level, according to one or more embodiments.

The semiconductor device manufactured in reference to FIG. 5A-5F may be or correspond to the semiconductor device including the interconnect structure 40 shown in FIGS. 4A and 4B, and the cross-section view of each of the intermediate semiconductor devices shown in FIGS. 5A-5F corresponds to that shown in FIG. 4B. Thus, duplicate descriptions about the same structural elements described above in reference to FIGS. 4A and 4B may be omitted, and the same reference numerals and characters shown therein may be used in the description herebelow.

Figure 5B:
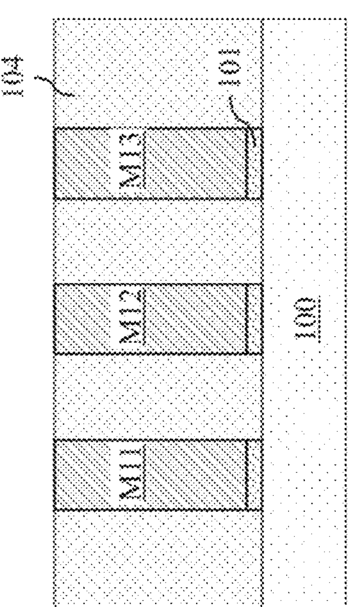
FIGS. 5A-5F illustrate cross-section views of intermediate semiconductor devices after respective steps of manufacturing a semiconductor device including an interconnect structure in which a metal jumper is formed to connect two adjacent metal lines at a same level, according to one or more embodiments.
Figure 5A:
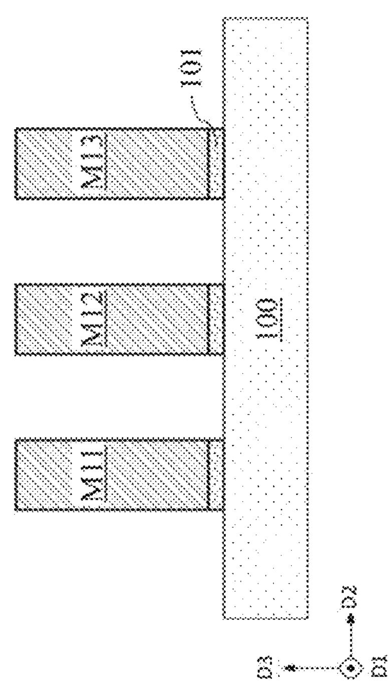

Referring to FIG. 5A, an intermediate semiconductor device may include a plurality of M1 metal lines M11-M13 having a predetermined pitch on a base layer 100 with a $1^{st}$ contact liner 101 therebetween.

The M1 metal lines M11-M13 may be patterned out through direct etching on an initial metal structure based on hard mask patterns on a top surface of the initial metal structure. The direct etching may be performed from the top surface of the initial metal structure through, for example, dry etching such as reactive ion etching (RIE) to form the M1 metal lines M11-M13 on the base layer 100 with the $1^{st}$ contact liner 101 therebetween.

The initial metal structure forming the M1 metal lines may be ruthenium (Ru) which provides a lower resistance and a reduced electromigration property than other metal materials such as copper (Cu). Alternatively, molybdenum (Mo) or cobalt (Co) may form the initial metal structure for the M1 metal lines.

The M1 metal lines M11-M13 may be formed to be extended in the $1^{st}$ direction D1 and arranged in the $2^{nd}$ direction D2 with the predetermined pitch.

Referring to FIG. 5B, an IMD layer 104 may be formed on the intermediate semiconductor device obtained in the previous step (FIG. 5A) to surround each of the M1 metal lines M11-M13 to isolate these M1 metal lines from each other and from other circuit elements.

The IMD layer 104 may be formed through, for example, depositing a low-k dielectric material such as silicon oxide ($SiO_2$) on the intermediate semiconductor device obtained in the previous step (FIG. 5A) through, for example, physical vapor deposition (PVD), chemical vapor deposition (CVD), plasma enhanced chemical vapor deposition (PECVD), atomic layer deposition (ALD), a combination thereof, etc., not being limited thereto. The deposition of the low-k dielectric material may be followed by planarization (e.g., chemical-mechanical polishing (CMP)) on top thereof such that top surfaces of the IMD layer 104 and the M1 metal lines M11-M13 are horizontally coplanar or aligned in the $1^{st}$ direction D1 and the $2^{nd}$ direction D2.

Figure 5D:
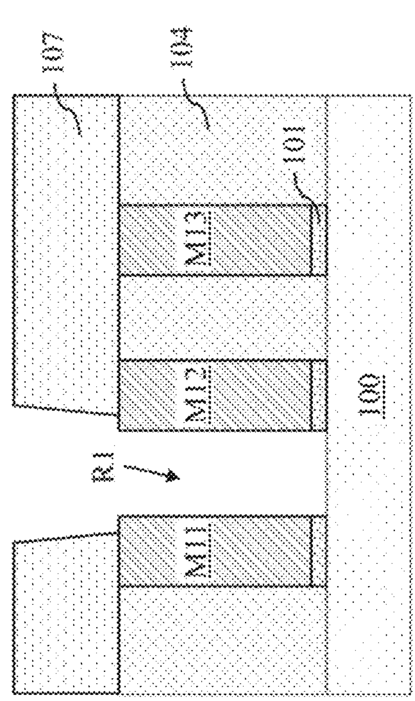
Figure 5C:
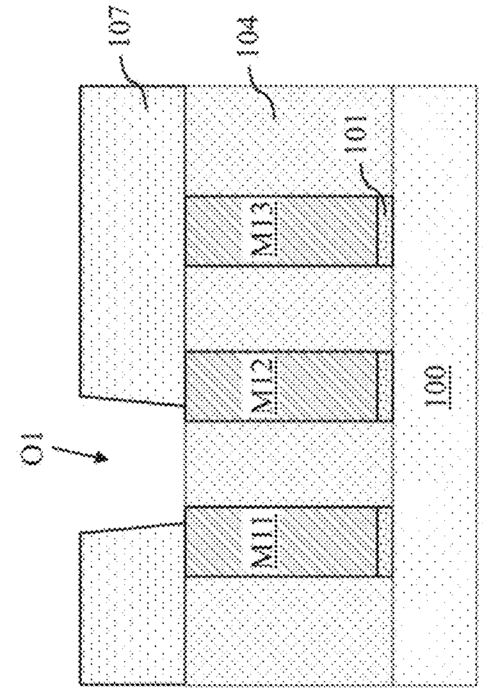
Figure 5F:
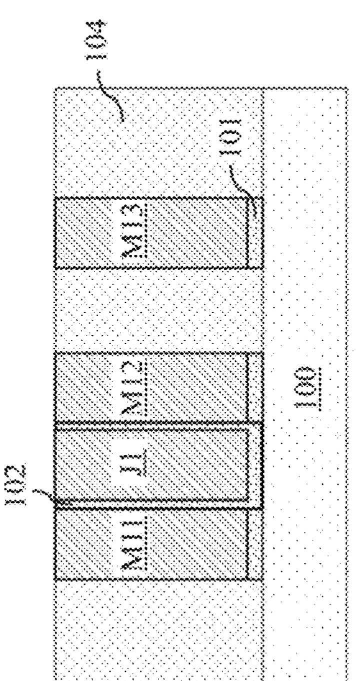
Figure 5E:
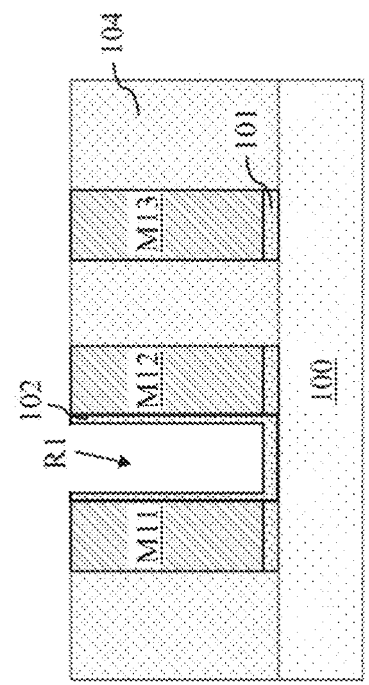

Referring to FIG. 5C, a hard mask layer 107 may be formed on the top surface of the intermediate semiconductor device obtained in the previous step (FIG. 5B), and patterned to expose a top surface of a portion of the IMD layer 104 to be etched in a next step (FIG. 5D) to provide a space where a metal jumper is to be formed between the M1 metal lines M11 and M12 to be connected to each other in a later step (FIG. 5E).

Due to the high metal pitch between the two M1 metal lines M11 and M12, an opening O1 provided by patterning the hard mask layer 107 may not expose only the top surface of a portion of the IMD layer 104 to be etched in the next step (FIG. 5D), and instead, may also expose top surfaces of edge portions of the two M1 metal lines M11 and M12.

The hard mask layer 107 may be formed of a material such as silicon nitride (SiN, $Si_3N_4$, etc.), not being limited thereto, which has an etch selectivity against the low-k dielectric material, such as silicon oxide ($SiO_2$), of the IMD layer 104 and a metal or metal compound (e.g., Ru) forming the M1 metal lines M11 and M12.

Referring to FIG. 5D, the IMD layer 104 may be patterned based on the opening O1 of the hard mask layer 107 to form a recess R1 which exposes a top surface of the base layer 100 between the M1 metal lines M11 and M12, a right side surface of the M1 metal line M11, and a left side surface of the M1 metal line M12 facing the right side surface of the M1 metal line M11.

The patterning of the IMD layer 104 formed of the low-k dielectric material such as silicon oxide ($SiO_2$) against the hard mask layer 107 may be performed through, for example, wet etching using an etchant such as hydrofluoric acid (HF) and/or dry etching such as plasma etching or RIE, not being limited thereto.

Referring to FIG. 5E, the hard mask layer 107 patterned to form the recess R1 may be removed from the intermediate semiconductor device obtained in the previous step, and a $2^{nd}$ contact liner 102 may be formed on an inner surface of the recess R1.

The removal of the hard mask layer 107 may be performed through, for example, ashing or stripping, not being limited thereto.

After removing the hard mask layer 107, the $2^{nd}$ contact liner 102, which may be formed of the same material (e.g., TiN) as the 1$^{st}$ contact liner 101, may be formed on the inner surface of the recess R1 to provide a reduced contact resistance and enhance adhesion to a metal jumper to be filled therein in a next step (FIG. 5F). The formation of the contact line 102 may be performed through, for example, atomic layer deposition (ALD), not being limited thereto.

Referring to FIG. 5F, a metal jumper J1 may be formed in the recess R1 with the contact liner 102 thereon to obtain a semiconductor device including the interconnect structure 40 shown in FIGS. 4A and 4B.

The metal jumper J1 formed in the recess R1 may connect the M1 metal lines M11 and M12. For example, the metal jumper J1 may contact the right side surface of the M1 metal line M11 and the left side surface of the M1 metal line M12 with the 2$^{nd}$ contact liner 102 therebetween to connect the two M1 metal lines. At this time, the metal jumper J1 may also contact a top surface an underlying structure in the base layer 100 with the 2$^{nd}$ contact liner 102 therebetween.

The metal jumper J1 may be formed by depositing a metal or metal compound which is the same as or different from that of the M1 metal lines M11 and M12. For example, when the metal jumper J1 may be formed of ruthenium (Ru) or copper (Cu). When the metal or metal compound is formed in the recess R1, an overflow may be extended in the 1$^{st}$ direction D1 beyond the top surfaces of the M1 metal lines M11 and M12.

Referring back to FIG. 5E, when the 2$^{nd}$ contact liner 102 is layered in the recess R1, an overflow of the material (e.g., TiN) forming the 2$^{nd}$ contact liner 102 may be formed on at least the top surfaces of the M1 lines M11 and M12. Further, when the metal jumper J1 is filled in the recess R1 with the 2$^{nd}$ contact liner 102 thereon, an overflow of the material (e.g., Ru) forming the metal jumper J1 may be formed on at least the top surfaces of the M1 lines M11 and M12. Thus, after the metal jumper J1 is formed in the recess R1, these overflow metals may be removed by planarization (e.g., CMP), so that a top surface of the metal jumper J1 may be horizontally coplanar or aligned with the top surfaces of the M1 metal lines M1 and M12 and the IMD layer 104 on the base layer 100. Alternatively, the overflow metal of the metal jumper J1 may be partially removed from the top surfaces of the M1 metal lines M11 and M12, and thus, the top surface of the metal jumper J1 may remain higher than a level of the top surfaces of the M1 metal lines M11 and M12, according to one or more other embodiments. Otherwise, the metal or metal compound forming the metal jumper J1 may be partially filled in the recess R1 to connect the two metal lines, according to one or more other embodiments.

Thus, the M1 metal lines M11 and M12 may be connected at the same level without using overlying or underlying vias and metal lines to achieve a reduced contact resistance, an area gain, and manufacturing simplicity in the critical minimum metal-pitch area of a semiconductor device.

The metal jumper J1 may be formed one or more different methods including the following embodiment.

FIGS. 6A-6H illustrate cross-section views of intermediate semiconductor devices after respective steps of manufacturing a semiconductor device including an interconnect structure in which a metal jumper is formed to connect two adjacent metal lines at a same level, according to one or more other embodiments.

The semiconductor device manufactured in reference to FIG. 6A-6H may be or correspond to the semiconductor device including the interconnect structure 40 shown in FIGS. 4A and 4B, and the cross-section view of each of the intermediate semiconductor devices shown in FIGS. 6A-6H corresponds to that shown in FIG. 4B. Thus, duplicate descriptions about the same structural elements described above in reference to FIGS. 4A and 4B may be omitted, and the same reference numerals and characters shown therein may be used in the description herebelow.

Figure 6B:
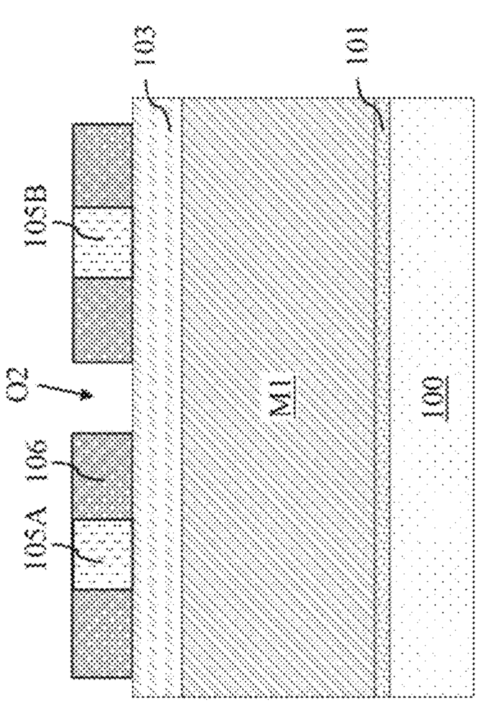
FIGS. 6A-6H illustrate cross-section views of intermediate semiconductor devices after respective steps of manufacturing a semiconductor device including an interconnect structure in which a metal jumper is formed to connect two adjacent metal lines at a same level, according to one or more other embodiments.
Figure 6A:
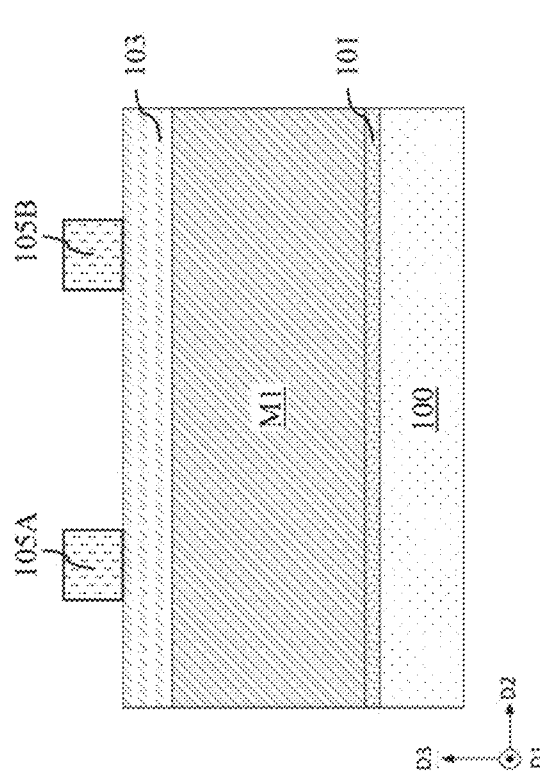

Referring to FIG. 6A, an intermediate semiconductor device may include an initial metal structure M1 formed on a base layer 100 with a contact liner 101 therebetween and a 1$^{st}$ hard mask layer 103 on a top surface of the initial metal structure M1 with 2$^{nd}$ hard mask patterns 105A and 105B thereon.

The initial metal structure M1 may be formed of a metal or metal compound which allows direct etching thereon. For example, the initial metal structure M1 may be formed of ruthenium (Ru), not being limited thereto, different from copper (Cu), which is known to very difficult to perform direction etching thereon. The initial metal structure M1 may be extended in the 1$^{st}$ direction D1 and the 2$^{nd}$ direction D2.

The 1$^{st}$ hard mask layer 103 may be formed by depositing a material such as silicon oxide ($SiO_2$) through, for example, PVD, CVD, PECVD, ALD or a combination thereof, not being limited thereto, on the top surface of the initial metal structure M1, followed by planarization (e.g., CMP) on top thereof. The 1$^{st}$ hard mask layer 103 may also be extended in the 1$^{st}$ direction D1 and the 2$^{nd}$ direction D2. For example, the 1$^{st}$ hard mask layer 103 may overlap the initial metal structure M1 both in the 1$^{st}$ direction D1 and the 2$^{nd}$ direction D2.

Figure 6D:
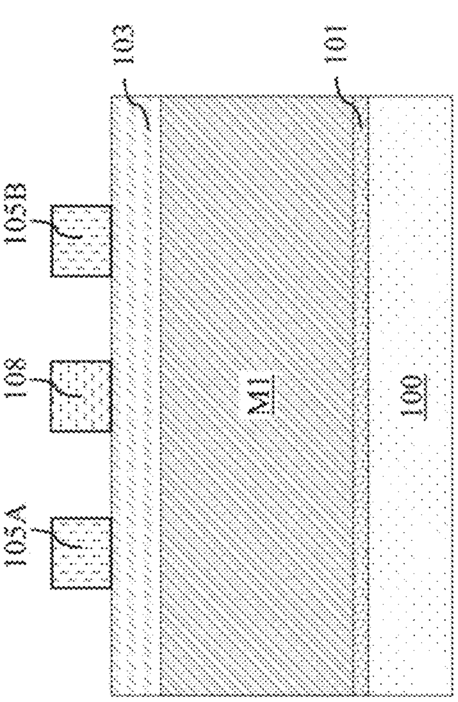
Figure 6C:
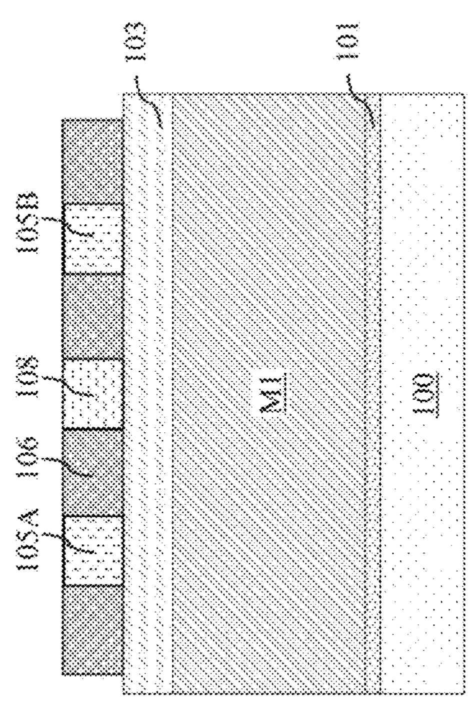
Figure 6F:
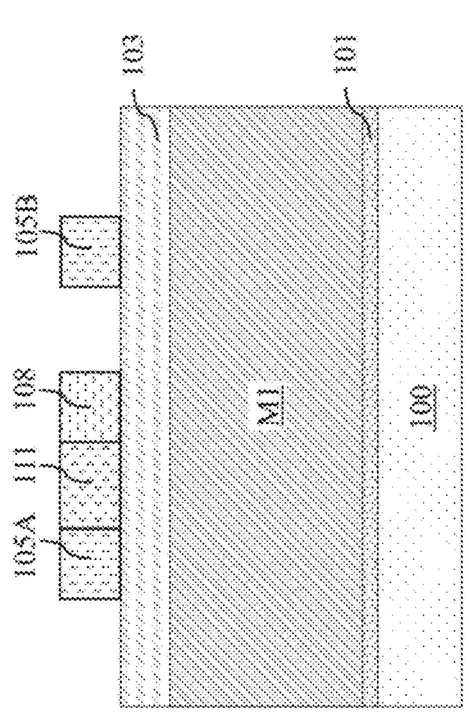
Figure 6E:
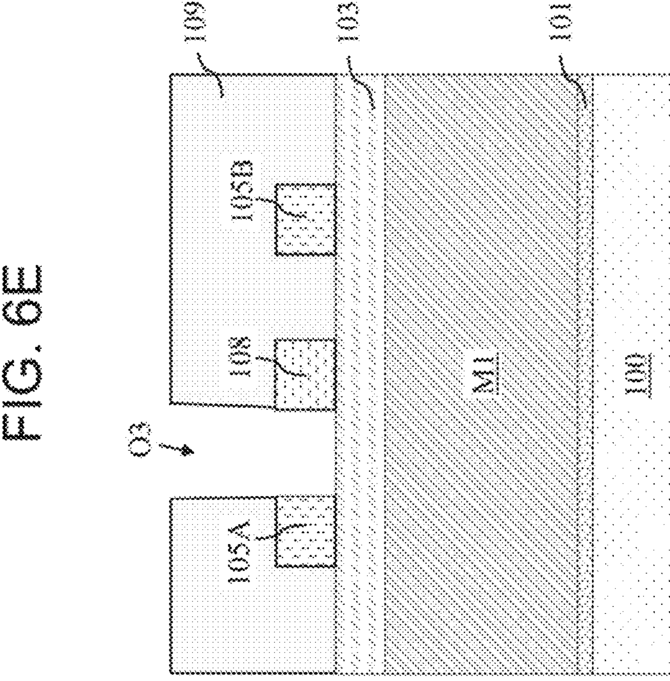
Figures 6G, 6H:
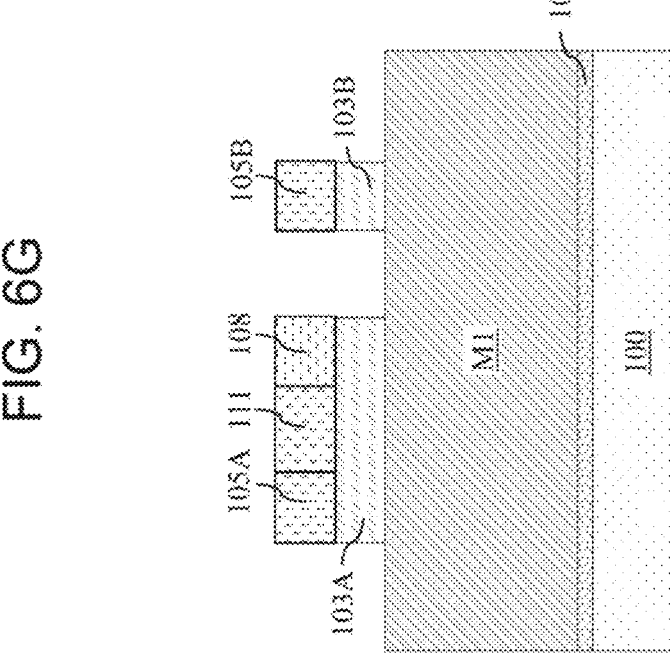
Figure 7B:
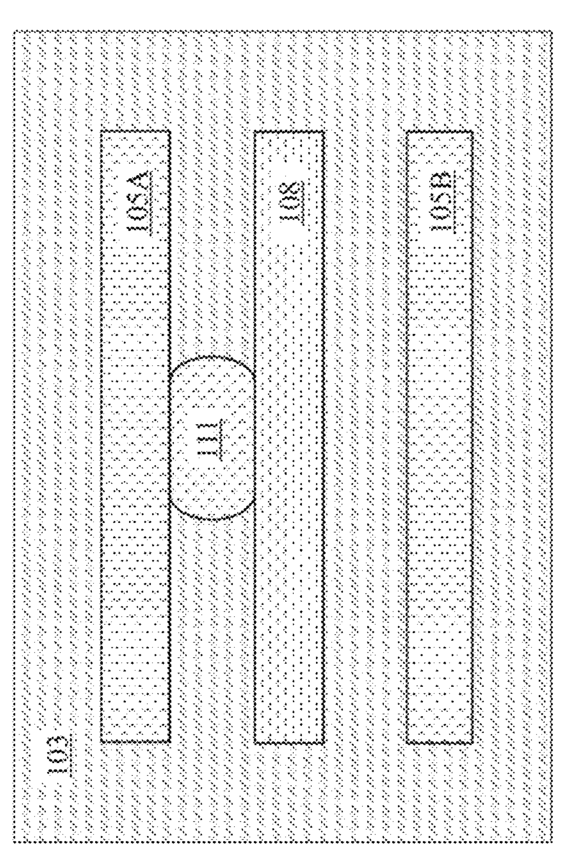
FIGS. 7A-7D illustrate plan views of the intermediate semiconductor devices shown in FIGS. 6E-6H, respectively, according to one or more embodiments.
Figure 7A:
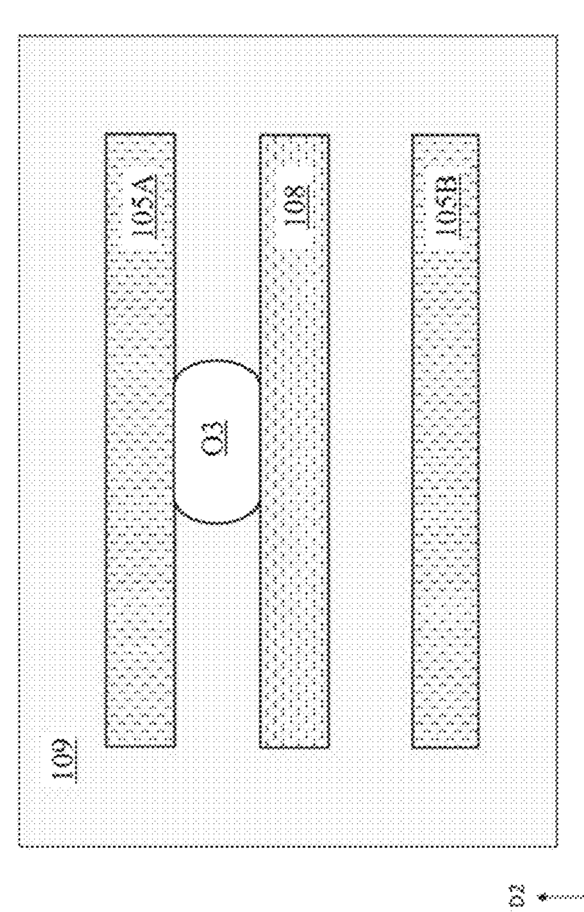
Figure 7D:
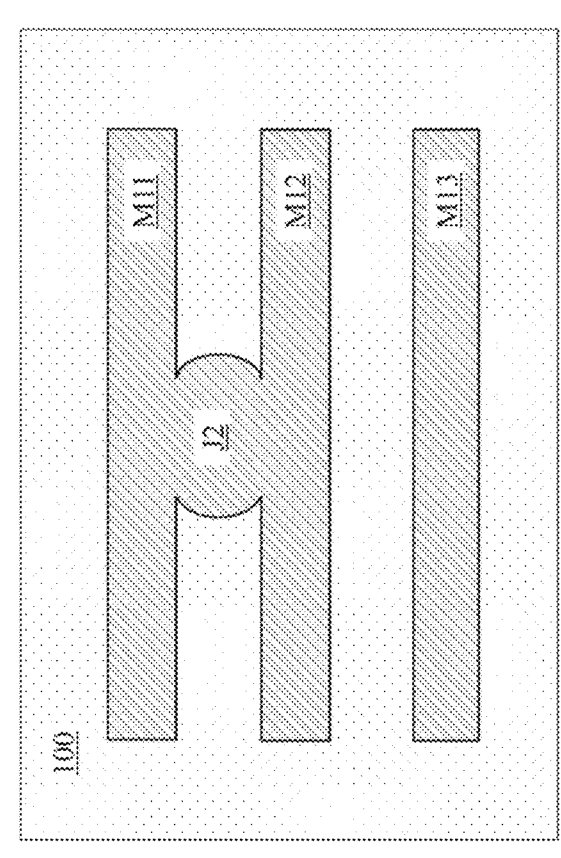

Further, the 2$^{nd}$ hard mask patterns 105A and 105B may be formed to be extended in the D1 direction on a top surface of the 1$^{st}$ hard mask layer 103 at positions below which two M1 metal lines M11 and M13 are to be patterned in a later step (FIGS. 6H and 7D). Thus, the 2$^{nd}$ hard mask patterns 105A and 105B may have widths defining widths of the M1 metal lines M11 and M13 in the 2$^{nd}$ direction D2. The formation of the 2$^{nd}$ hard mask patterns 105A and 105B may be performed on a 2$^{nd}$ hard mask layer through, for example, a photolithography operation. The 2$^{nd}$ hard mask patterns 105A and 105B may be formed of silicon nitride (e.g., SiN, $Si_3N_4$, etc.), not being limited thereto, having etch selectivity against the 1$^{st}$ hard mask layer 103, which may be formed of silicon oxide ($SiO_2$), for example.

Referring to FIG. 6B, a spacer 106 having a predetermined width in the 2$^{nd}$ direction D2 may be formed on side surfaces of the 2$^{nd}$ hard mask patterns 105A and 105B included in the intermediate semiconductor device of FIG. 6A The spacer 106 may be formed to define a metal-to-metal distance between M1 metal lines in an M1 metal layer, and thus, the predetermined width of the spacer 106 is to be a distance of two adjacent M1 metal lines to be formed in a later step (FIGS. 6H and 7D). The spacers 106 may be formed through, for example, ALD of a material such as titanium nitride (TiN) or tantalum nitride (TaN) along side surfaces of the 2$^{nd}$ hard mask patterns 105A and 105B, not being limited thereto, extended in the 1$^{st}$ direction D1.

After the formation of the spacers 106 along the side surfaces of the 2$^{nd}$ hard mask patterns 105A and 105B, an opening O2 may be formed between two adjacent spacers 106, for example, a spacer 106 on a right side surface of the 2$^{nd}$ hard mask pattern 105A and a spacer 106 on a left side surface of the 2$^{nd}$ hard mask pattern 105B. The spacers 106 may extend in the 1$^{st}$ direction D1 along the side surfaces of the 2$^{nd}$ hard mask patterns 105A and 105B which also extend in the 1$^{st}$ direction D1, and further, top surfaces of the spacers 106 may be horizontally coplanar or aligned with top surfaces of the 2$^{nd}$ hard mask patterns 105A and 105B.

Referring to FIG. 6C, the opening O2 formed between the two adjacent spacers 106 in the intermediate semiconductor device of FIG. 6B may be filled in with a 3$^{rd}$ hard mask pattern 108.

The 3$^{rd}$ hard mask pattern 108 may be formed in the opening O2 to be also extended in the 1$^{st}$ direction D1 along side surfaces of the two adjacent spacers 106 extended in the 1$^{st}$ direction D1 at both sides of the opening O2.

The formation of the 3$^{rd}$ hard mask pattern 108 may be performed by depositing a material (e.g., silicon nitride) which may be the same as that forming the 2$^{nd}$ hard mask patterns 105A and 105B through, for example, PVD, CVD, PECVD, ALD or a combination thereof, followed by planarization (e.g., CMP) on top thereof so that top surfaces of the 2$^{nd}$ hard mask patterns 105A, 105B, the spacers 106, and the 3$^{rd}$ hard mask pattern 108 may be horizontally coplanar or aligned with each other.

Referring to FIG. 6D, the spacers 106 may be pulled off to leave only the 2$^{nd}$ and 3$^{rd}$ hard mask patterns 105A, 105B and 108 on the top surface of the 1$^{st}$ hard mask layer 103.

The spacers 106 may be removed through, for example, dry etching such as plasma etching or RIE selectively removing the spacer material (e.g., TiN or TaN, not being limited thereto) against the hard mask pattern material (e.g., silicon nitride and silicon oxide, not being limited thereto).

As three M1 metal layers are to be patterned in a later step (FIGS. 6H and 7D) from the initial metal structure M1 based on the hard mask patterns 105A, 108 and 105B arranged in this order in the 2$^{nd}$ direction D2 on the top surface of the 1$^{st}$ hard mask pattern 103, a distance between the two adjacent hard mask patterns 105A (or 105B) and 108 may define a metal-to-metal distance of the M1 metal lines in the 2$^{nd}$ direction D2, which is the same as the width of the spacer 106 in the same direction.

Referring to FIG. 6E, a 4$^{th}$ hard mask layer 109 may be formed on the intermediate semiconductor device of FIG. 6D and patterned to form an opening O3 corresponding to a metal jumper to be formed in subsequent steps.

The 4$^{th}$ hard mask layer 109 may be formed through, for example, spin-coating a material such as silicon carbide (SiC) on a top surface of the intermediate semiconductor device obtained in the previous step (FIG. 6D), thereby forming a spin-on-hardmask (SOH). Subsequently, the 4$^{th}$ hard mask layer 109 may be patterned at a position below which a metal jumper is to be formed in a later step (FIGS. 6H and 7D).

Since the metal jumper may be formed to connect only a portion of two adjacent M1 metal lines to be patterned based on the hard mask patterns 105A and 105B, respectively, the opening O3 may be patterned only to correspond to an area of the metal jumper as shown in FIG. 7A, which illustrates a plan view of the intermediate semiconductor device shown in FIG. 6E, according to one or more embodiments.

Referring to FIG. 6F, the opening O3 formed in the intermediate semiconductor device of FIG. 6E may be filled in with a 5$^{th}$ hard mask pattern 111, and the 4$^{th}$ hard mask layer 109 may be removed from the intermediate semiconductor device.

The 5$^{th}$ hard mask pattern 111 may be formed by depositing a material (e.g., silicon nitride), which may be similar to those of the 2$^{nd}$ and 3$^{rd}$ hard mask patterns 105A, 105B and 108, in the opening O3 through, for example, PVD, CVD, PECVD, ALD or a combination thereof, so that the 5$^{th}$ hard mask pattern 111 may fill out a portion of a space between the 2$^{nd}$ hard mask pattern 105A and the 3$^{rd}$ hard mask pattern 108 which corresponds to the metal jumper to be formed in a later step (FIGS. 6H and 7D).

Subsequently, the 4$^{th}$ hard mask layer 109 may be removed through, for example, stripping or ashing, and planarization (e.g., CMP) may be performed on the 5$^{th}$ hard mask pattern 111 so that a top surface of the 5$^{th}$ hard mask pattern 111 can be horizontally coplanar or aligned with the top surfaces of the other hard mask patterns 105A 105B and 108. FIG. 7B illustrates a plan view of the intermediate semiconductor device shown in FIG. 6F, according to one or more embodiments.

Referring to FIG. 6G, the 1$^{st}$ hard mask layer 103 formed on the top surface of the initial metal structure M1 may be patterned based on the 2$^{nd}$, 3$^{rd}$ and 5$^{th}$ hard mask patterns 105A, 105B, 108 and 111, thereby forming two 1$^{st}$ hard mask patterns 103A and 103B from the 1$^{st}$ hard mask layer 103.

Dry etching may be performed on the hard mask layer 103 based on the 2$^{nd}$ hard mask pattern 105A, the 5$^{th}$ hard mask pattern 111, the 3$^{rd}$ hard mask pattern 108 and the other 2$^{nd}$ hard mask pattern 105B arranged in this order in the 2$^{nd}$ direction D2 on the top surface of the 1$^{st}$ hard mask layer 103.

Figure 7C:
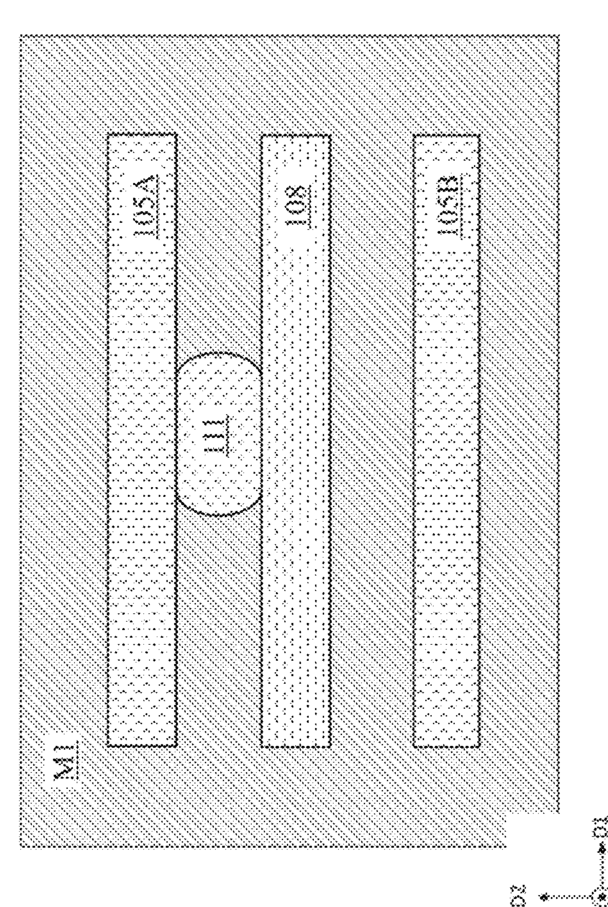

By the patterning operation in this step, the 1$^{st}$ hard mask layer 103 may be patterned to form the 1$^{st}$ hard mask patterns 103A and 103B. The 1$^{st}$ hard mask pattern 103A may be vertically overlapped by the 2$^{nd}$ hard mask pattern 105A, the 5$^{th}$ hard mask pattern 111, and the 3$^{rd}$ hard mask pattern 108, and the other 1$^{st}$ hard mask pattern 103B may be vertically overlapped by the other 2$^{nd}$ hard mask pattern 105B. FIG. 7C illustrates a plan view of the intermediate semiconductor device shown in FIG. 6G, according to one or more embodiments.

Referring to FIG. 6H, the initial metal structure M1 may be patterned based on the 1$^{st}$ hard mask patterns 103A and 103B with the other hard mask patterns 105A, 111, 108 and 105B thereon to form M1 metal lines M11-M13 and a metal jumper J2 as shown in FIG. 7D, which illustrates a plan view of the intermediate semiconductor device shown in FIG. 6H, according to one or more embodiments.

The M1 metal lines M11-M13 and the metal jumper J2 formed between the M1 metal lines M11 and M12 may be patterned through, for example, dry etching such as RIE or plasma etching. As the metal jumper J2 is formed based on the 5$^{th}$ hard mask pattern 111 and a portion of the 1$^{st}$ hard mask pattern 103A vertically overlapped by the 5$^{th}$ hard mask pattern 111, the metal jumper J2 may be formed only between portions of the M1 metal lines M11 and M12 corresponding to the opening O3 shown in FIGS. 6E and 7A. Thus, a length of the metal jumper J2 may be smaller than a length of at least one of the M1 metal lines M11 and M12 in the 1$^{st}$ direction D1. Accordingly, the metal jumper J2 may take a protrusion shape from the M1 metal line M11 toward the M1 metal line M12 or vice versa.

Here, the metal jumper J2 may be formed along with the M1 metal lines M11 and M12 as a single continuum structure from the initial metal structure M1. Thus, no connection surface, interface or barrier layer may be formed between the M1 metal line M11 and the metal jumper J2 and between the metal jumper J2 and the M1 metal line M13. In contrast, the metal jumper J1 of the interconnect structure 40 shown in FIGS. 4A, 4B and 5A-5F may be connected to the M1 metal lines M11 and M12 through the 2$^{nd}$ contact liner 102, which may form a connection surface, interface or barrier layer. Even when the 2$^{nd}$ contact liner 102 is not formed between the metal jumper J2 and the M1 metal lines M11 and M13 in the interconnect structure 40, a connection surface, interface or barrier layer may be formed therebetween because the metal jumper J1 is formed in the recess R1 (FIGS. 5E-5F) between the M1 metal lines M11 and M12 which are formed earlier than the formation of the recess R1.

The metal jumper J2 formed as shown in FIGS. 6H and 7D may also achieve a reduced contact resistance, area gain, and manufacturing simplicity because no overlying metal lines and vias are required to connect the two adjacent M1 metal lines M11 and M12 at the same level. Moreover, the contact resistance may be further reduced when the metal jumper J2 is formed to connect the M1 metal lines M11 and M12 because there is no connection surface, interface or barrier layer formed in a single continuum structure formed at the same time, as described above.

Figures 8A, 8B:
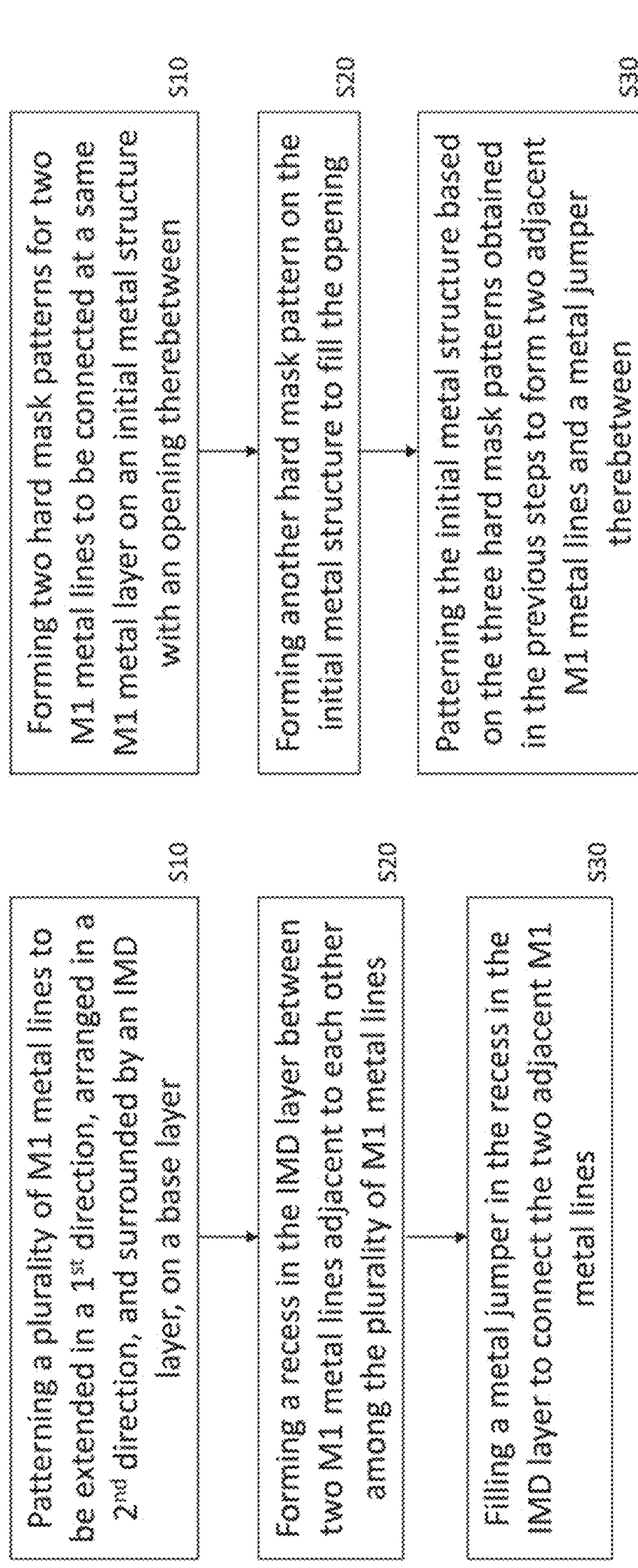
FIG. 8A illustrates a flowchart for a method of manufacturing a semiconductor device including an interconnect structure in which a metal jumper is formed to connect two adjacent metal lines at a same level, in reference to FIGS. 5A-5F, according to one or more embodiments.
FIG. 8B illustrates a flowchart for a method of manufacturing a semiconductor device including an interconnect structure in which a metal jumper is formed to connect two adjacent metal lines at a same level, in reference to FIGS. 6A-6H, according to one or more embodiments.

FIG. 8A illustrates a flowchart for a method of manufacturing a semiconductor device including an interconnect structure in which a metal jumper is formed to connect two adjacent metal lines at a same level, in reference to FIGS. 5A-5F, according to one or more embodiments.

In step S10, a plurality of M1 metal lines may be patterned to be extended in a $1^{st}$ direction D1, arranged in a $2^{nd}$ direction D2, and surrounded by an IMD layer, on a base layer (FIGS. 5A-5B).

The M1 metal lines may be at a same M1 metal layer in a critical metal-pitch area having a very high metal line pitch in an intermediate semiconductor device. The M1 metal lines may have been directly etched from an initial metal structure formed of ruthenium (Ru).

In step S20, a recess may be formed in the IMD layer between two M1 metal lines adjacent to each other among the plurality of M1 metal lines (FIGS. 5C-5D).

The recess may have a length smaller than at least one of the two metal lines in the $1^{st}$ direction D1. The recess may or may not expose the top surface of the base layer. In an inner surface of the recess, a contact liner formed of TiN or TaN may or may not be layered.

In step S30, a metal jumper may be filled in the recess in the IMD layer to connect the two adjacent M1 metal lines in the $2^{nd}$ direction D2 (FIGS. 5E-5F).

As the metal jumper is filed in the recess formed in the previous step of S20, the metal recess may have the same or similar shape as the recess in a plan view, and thus, a length of the metal jumper in the $1^{st}$ direction D1 may be smaller than at least one of the two M1 metal lines. In a case where the contact liner is formed, the metal jumper may connect the two M1 metal lines through the contact liner which may provide a reduced contact resistance and adhesion properties. A material composition of the metal jumper may be the same as or different from that of the M1 metal lines.

FIG. 8B illustrates a flowchart for a method of manufacturing a semiconductor device including an interconnect structure in which a metal jumper is formed to connect two adjacent metal lines at a same level, in reference to FIGS. 6A-6H, according to one or more embodiments.

In step S10, two hard mask patterns corresponding to two M1 metal lines to be connected to each other at a same M1 metal layer may be formed on an initial metal structure with an opening therebetween (FIGS. 6A-6E and 7A).

The two hard mask patterns (105A and 108 in FIG. 6D) may define the two M1 metal lines (M11 and M12 in FIGS. 6H and 7D) to be patterned out therebelow in a next step, and thus, the widths thereof may be the same as widths of the two M1 metal lines, respectively. Further, a distance between the two hard mask patterns in the $1^{st}$ direction D1 on the initial metal structure may define a width of a metal jumper to be patterned from the initial metal structure to connect the two M1 metal lines. The initial metal structure may be formed of ruthenium (Ru).

In step S20, another hard mask pattern may be formed on the initial metal structure to fill the opening between the two hard mask patterns formed in the previous step S10 (FIGS. 6F and 7B).

While the two hard mask patterns respectively defining the two M1 metal lines may be extended in a $1^{st}$ direction, the hard mask pattern interposed therebetween (to fill the distance between the two hard mask patterns) may not be extended to the full length of the two M1 metal lines in the $1^{st}$ direction.

In step S30, the initial metal structure may be patterned based on the three hard mask patterns obtained in the previous steps S10 and S20 to form two adjacent M1 metal lines and a metal jumper therebetween connecting the two M1 metal lines in a $2^{nd}$ direction D2 (FIGS. 6G-6H and 7C-7D).

Since the metal jumper is patterned out based on the three connected hard mask patterns substantially at the same time, the two M1 metal lines and the metal jumper therebetween may form a single continuum metal structure having the same material composition without a connection surface, interface or barrier layer therebetween. Further, due to the short length of the interpose hard mask pattern corresponding to the metal jumper, the metal jumper has a smaller length than the two M1 metal lines in the $1^{st}$ direction D1.

The above embodiments provide an interconnect structure including three M1 metal lines M11-M13 at the M1 metal layer and a metal jumper J1 or J2 connecting two adjacent M1 metal lines M11 and M12 among the three M1 metal lines M11-M13. However, the disclosure is not limited thereto. The metal jumper J1 or J2 may be formed in an interconnect structure having more or less than three M1 metal lines to connect two adjacent M1 metal lines, according to one or more other embodiments. Further, the metal jumper J1 or J2 may connection two adjacent M2 metal lines in an M2 metal layer above the M1 metal layer, or a different metal layer, according to one or more other embodiments.

Figure 9:
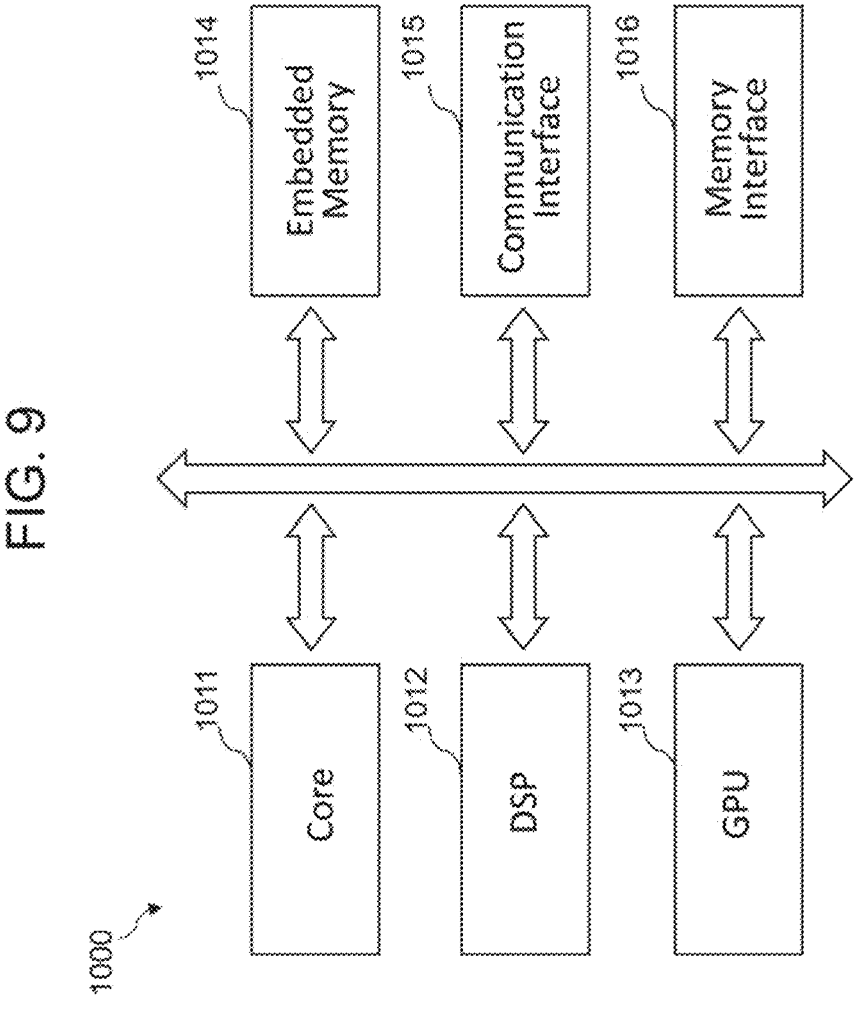
FIG. 9 is a block diagram of a system-on-chip (SoC) 1000 including at least one of the semiconductor device shown in FIGS. 4A-4B and FIG. 5F and the semiconductor device shown in FIGS. 6H and 7D, according to one or more embodiments.

FIG. 9 is a block diagram of a system-on-chip (SoC) 1000 including at least one of the semiconductor device shown in FIGS. 4A-4B and FIG. 5F and the semiconductor device shown in FIGS. 6H and 7D, according to one or more embodiments.

Referring to FIG. 9, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data for use by the core 1011, the DSP 1012, and the GPU 1013. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include at least one of the semiconductor device shown in FIGS. 4A-4B and FIG. 5F and the semiconductor device shown in FIGS. 6H and 7D.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:

a base layer;

a $1^{st}$ metal line extending in a $1^{st}$ direction on the base layer;

a $2^{nd}$ metal line extending in the $1^{st}$ direction, and adjacent to the $1^{st}$ metal line in a $2^{nd}$ direction intersecting the $1^{st}$ direction, at a same level as the $1^{st}$ metal line in a 3rd direction intersecting the $1^{st}$ direction and the $2^{nd}$ direction, on the base layer;

a metal jumper, between the $1^{st}$ metal line and the $2^{nd}$ metal line, at the same level; and a $1^{st}$ contact liner between the metal jumper and at least one of the $1^{st}$ metal line and the $2^{nd}$ metal line, wherein the metal jumper electrically connects the $1^{st}$ metal line and the $2^{nd}$ metal line.

2. The semiconductor device of claim 1, wherein the metal jumper has a smaller length than the $1^{st}$ metal line or the $2^{nd}$ metal line in the $1^{st}$ direction.

3. The semiconductor device of claim 1, wherein the $1^{st}$ contact liner extends to a bottom surface of the metal jumper.

4. The semiconductor device of claim 1, wherein the contact liner comprises titanium nitride.

5. The semiconductor device of claim 1, further comprising a $2^{nd}$ contact liner between the base layer and a bottom surface of the $1^{st}$ metal line or the $2^{nd}$ metal line.

6. The semiconductor device of claim 1, wherein top surfaces of the $1^{st}$ metal line, the metal jumper, and the $2^{nd}$ metal line are horizontally coplanar or aligned in the $2^{nd}$ direction.

7. The semiconductor device of claim 1, wherein the $1^{st}$ metal line, the $2^{nd}$ metal line, and the metal jumper have the same material composition.

8. The semiconductor device of claim 1, wherein a bottom surface of the metal jumper is at a level above a bottom surface of the $1^{st}$ metal line or the $2^{nd}$ metal line in the $3^{rd}$ direction.

9. The semiconductor device of claim 1, wherein the metal jumper has a material composition different from that of the $1^{st}$ metal line and the $2^{nd}$ metal line.

10. The semiconductor device of claim 9, wherein the $1^{st}$ metal line and the $2^{nd}$ metal line comprise ruthenium (Ru).

11. A method of manufacturing a semiconductor device, the method comprising:

etching an initial metal structure to form a $1^{st}$ metal line and a $2^{nd}$ metal line extending in a $1^{st}$ direction and adjacent in a $2^{nd}$ direction intersecting the $1^{st}$ direction, at a same level;

forming a dielectric layer between the $1^{st}$ metal line and the $2^{nd}$ metal line;

forming a hard mask layer with an opening exposing the dielectric layer between the $1^{st}$ metal line and the $2^{nd}$ metal line;

forming a recess in the dielectric layer between the $1^{st}$ metal line and the $2^{nd}$ metal line exposing a side surface of the $1^{st}$ metal line and a side surface of the $2^{nd}$ metal line, the recess having a smaller length than the $1^{st}$ metal line or the $2^{nd}$ metal line in the $1^{st}$ direction; and forming a metal jumper in the recess such that the metal jumper electrically connects the $1^{st}$ metal line and the $2^{nd}$ metal line.

12. The method of claim 11, further comprising forming a contact liner in the recess, wherein the metal jumper is connected to the $1^{st}$ metal line and the $2^{nd}$ metal line through the contact liner.

13. The method of claim 12, wherein the contact liner comprises titanium nitride.

14. The method of claim 13, wherein the metal jumper has a material composition different from that of the $1^{st}$ metal line and the $2^{nd}$ metal line.

* * * * *